United States Patent
Huang

(10) Patent No.: US 7,274,245 B2
(45) Date of Patent: Sep. 25, 2007

(54) VOLTAGE TRANSFER CIRCUIT

(75) Inventor: Chien-Hua Huang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 11/162,667

(22) Filed: Sep. 19, 2005

(65) Prior Publication Data

US 2006/0232322 A1   Oct. 19, 2006

Related U.S. Application Data

(60) Provisional application No. 60/594,497, filed on Apr. 13, 2005.

(51) Int. Cl.
*H03K 17/00* (2006.01)

(52) U.S. Cl. .................................. 327/407; 327/408

(58) Field of Classification Search ............... 327/536, 327/407, 408; 363/59–60
See application file for complete search history.

(56) References Cited

U.S. PATENT DOCUMENTS

| | | | |
|---|---|---|---|
| 5,874,843 A | 2/1999 | Wang | |
| 5,877,635 A | 3/1999 | Lin | |
| 6,046,626 A | 4/2000 | Saeki et al. | |
| 6,216,246 B1 | 4/2001 | Shau | |
| 6,359,497 B1 * | 3/2002 | Criscione | 327/408 |
| 6,449,211 B1 | 9/2002 | Jungroth et al. | |
| 6,815,998 B1 * | 11/2004 | Samad | 327/530 |
| 6,882,215 B1 * | 4/2005 | Lee | 327/536 |
| 6,995,599 B2 * | 2/2006 | Huang et al. | 327/408 |

* cited by examiner

*Primary Examiner*—Quan Tra
*Assistant Examiner*—Rey Aranda
(74) *Attorney, Agent, or Firm*—Baker & McKenzie LLP

(57) ABSTRACT

A voltage transfer circuit outputs an equivalent to an input voltage when enabled. Otherwise, the transfer circuit is in standby and outputs an equivalent to a standby voltage (e.g., signal ground). The voltage transfer circuit includes a switching circuit, a standby circuit, and an input-transfer circuit. The output of the transfer circuit is fed back to both the switching circuit and the input-transfer circuit. When the transfer circuit is in standby, the feedback of the output voltage provides for voltage-balancing in the input-transfer circuit, thereby reducing or eliminating leakage current in the input-transfer circuit. Similarly, when the transfer circuit is in active mode, the feedback of the output voltage provides for voltage-balancing in the standby circuit, thereby reducing or eliminating leakage current in the standby circuit.

4 Claims, 2 Drawing Sheets

VOLTAGE TRANSFER CIRCUIT

CROSS-REFERENCE TO RELATED APPLICATIONS

This application claims priority to U.S. Provisional Patent Application No. 60/594,497 filed on Apr. 13, 2005, entitled "Voltage Transfer Circuit," the entire contents of which is hereby incorporated by reference.

TECHNICAL FIELD

The present invention relates to a voltage transfer circuit, particularly to a voltage transfer circuit comprising semiconductor devices and having high transfer efficiency.

BACKGROUND

A typical voltage transfer circuit can be controlled by a binary enable signal to operate in an active mode where the transfer circuit outputs an equivalent to an input voltage, or in a standby mode where the transfer circuit outputs an equivalent to a standby voltage (e.g., signal ground). For example, a negative voltage transfer circuit can output a negative voltage VBB while enabled or a signal ground VSS while in standby. Voltage transfer circuits are used in a wide variety of applications. For example, in a semiconductor memory such as a DRAM or the like, word lines for selecting memory cells are connected to transfer transistors of memory cells. In general, high level voltages (boost voltages) of the word lines are set to a value higher than the power supply voltage so as to improve the data retention characteristics of the memory cells. This higher voltage value is often achieved by supplementing the voltage received from the power supply with a voltage provided by a voltage transfer circuit.

SUMMARY

Disclosed herein is an improved voltage transfer circuit. According to concepts disclosed herein, a voltage transfer circuit uses feedback of an output voltage for circuit balancing that reduces or eliminates dissipation, for example caused by a leakage current. As a result, the transfer efficiency of the voltage transfer circuit disclosed herein is improved.

In a preferred embodiment, a voltage transfer circuit outputs an equivalent to an input voltage when enabled. Otherwise, the transfer circuit is in standby and outputs an equivalent to a standby voltage (e.g., signal ground). The voltage transfer circuit includes a switching circuit, a standby circuit, and an input-transfer circuit. The output of the transfer circuit is fed back to both the switching circuit and the input-transfer circuit. When the transfer circuit is in standby, the feedback of the output voltage provides for voltage-balancing in the input-transfer circuit, thereby reducing or eliminating leakage current in the input-transfer circuit. Similarly, when the transfer circuit is in active mode, the feedback of the output voltage provides for voltage-balancing in the standby circuit, thereby reducing or eliminating leakage current in the standby circuit.

In a preferred embodiment of the voltage transfer circuit, the standby circuit includes a Negative channel Metal-Oxide Semiconductor (NMOS) transistor having its drain connected to the output of the transfer circuit, its source connected to a standby voltage source (e.g., signal ground line), and its gate connected to receive voltage output from the switching circuit. In this embodiment, the input-transfer circuit includes a first Positive channel Metal-Oxide Semiconductor (PMOS) transistor having its drain connected to the output of the transfer circuit and its source connected to the input of the transfer circuit. The input-transfer circuit can also include a second PMOS transistor having its drain and source connected together such that it functions as a capacitor. The source/drain of the second PMOS transistor can be connected to receive voltage output from the switching circuit, and the gate of the second PMOS transistor can be connected to the gate of the first PMOS transistor. The input-transfer circuit can further include a third PMOS transistor having its drain connected to the gates of the first and second PMOS transistors, its source connected to the output of the transfer circuit, and its gate connected to the input of the transfer circuit.

BRIEF DESCRIPTION OF THE DRAWINGS

Embodiments are illustrated by way of example in the accompanying figures, in which like reference numbers indicate similar parts, and in which.

DETAILED DESCRIPTION OF THE PREFERRED EMBODIMENTS

Figure 1:
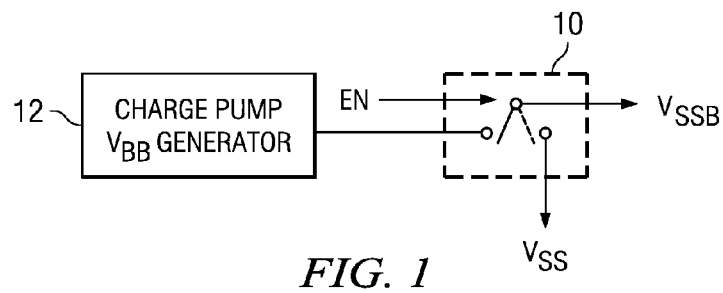
FIG. 1 shows a block diagram of a system including a transfer circuit.

FIG. 1 shows a block diagram of a system that includes a transfer circuit 10 for selectively transferring an input voltage $V_{BB}$, which is a negative voltage received from a charge pump 12. The operation of the transfer circuit 10 is controlled by an enable signal EN. When the enable signal EN is set to a logic high level, the transfer circuit 10 operates in a standby mode and outputs an output voltage $V_{SSB}$ equivalent to a standby voltage $V_{SS}$ (e.g., signal ground from a signal ground line). When the enable signal EN is set to a logic low level, the transfer circuit 10 operates in an active mode and the output voltage $V_{SSB}$ is equivalent to the input voltage $V_{BB}$. It should be noted that the term "equivalent" is used to mean equal in voltage but for any deviations caused by noise, leakage, IR drop, and/or charge redistribution. Such deviations exist, for example, between the input voltage $V_{BB}$ and the output voltage $V_{SSB}$ according to the transfer efficiency (i.e., ratio of output voltage to input voltage) of the transfer circuit 10.

Figure 2:
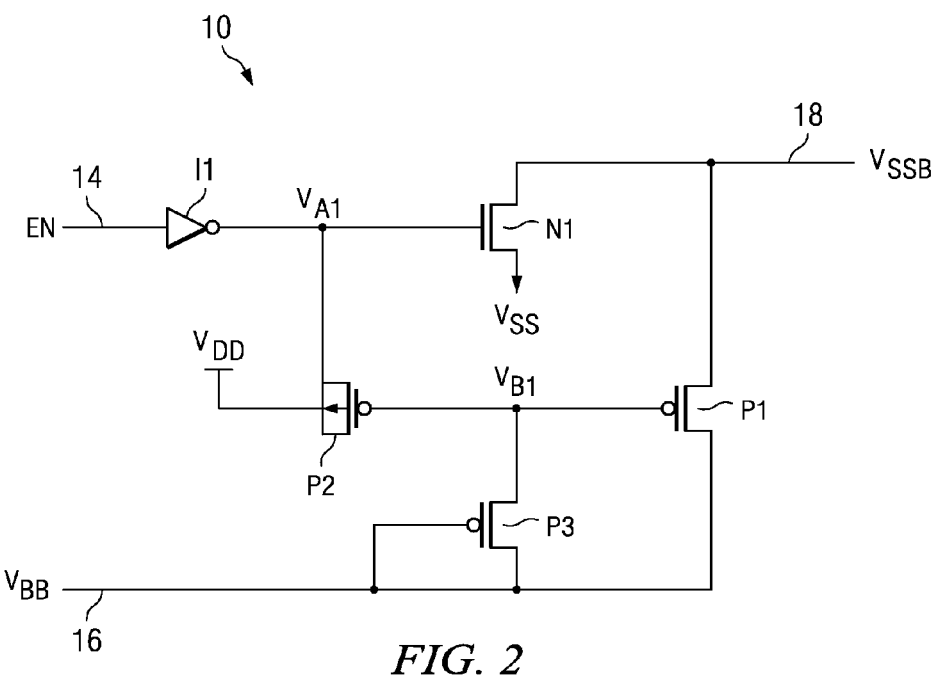
FIG. 2 shows a circuit diagram schematically illustrating an implementation of the transfer circuit in the block diagram shown in FIG. 1.

For example, consider the transfer circuit 10 shown in FIG. 2. FIG. 2 shows a circuit diagram schematically illustrating an implementation of the transfer circuit 10 in the block diagram shown in FIG. 1. As shown in FIG. 2, the transfer circuit 10 includes a control line 14 for receiving the enable signal EN, an input line 16 for receiving the input voltage $V_{BB}$, and an output line 18 for outputting the output voltage $V_{SSB}$. When the enable signal EN is low, the transfer circuit 10 operates in standby mode where the output voltage $V_{SSB}$ is equivalent to the standby voltage $V_{SS}$. Conversely, when the enable signal EN is high, the transfer circuit 10 operates in active mode where the output voltage $V_{SSB}$ is equivalent to the input voltage $V_{BB}$.

The transfer circuit 10 includes a CMOS (Complementary Metal-Oxide Semiconductor) inverter I1, which receives the enable signal EN via the control line 14. The inverter I1 outputs (as voltage $V_{A1}$) either a voltage equivalent to a source voltage $V_{DD}$ (for EN=low) or a voltage equivalent to a signal ground voltage $V_{SS}$ (for EN=high). The transfer circuit 10 also includes an NMOS transistor N1 having its source connected to $V_{SS}$ and its drain connected to the output line 18. The gate of the NMOS transistor N1 is connected to receive voltage $V_{A1}$ from the inverter I1.

The transfer circuit 10 further includes three PMOS transistors P1-P3. The PMOS transistor P1 has its drain connected to the output line 18 and its source connected to the input line 16. The gate of the PMOS transistor P1 is connected to receive a voltage $V_{B1}$ from a node that is connected to both the gate of the PMOS transistor P2 and the drain of the PMOS transistor P3. The PMOS transistor P2 is configured to serve as a MOS capacitor, having its drain and source both connected to receive voltage $V_{A1}$ from the inverter I1. The drain and source of the PMOS transistor P2 are also connected to source voltage $V_{DD}$ (e.g., from a source voltage line). The PMOS transistor P3 has its source and gate both connected to receive the input voltage $V_{BB}$ via input line 16.

Still referring to FIG. 2, the transfer circuit 100 operates as follows. When the enable signal EN is low, the inverter I1 pulls the voltage $V_{A1}$ up to an equivalent of $V_{DD}$. As a result, the NMOS transistor N1 is turned on, pulling the output voltage $V_{SSB}$ down to an equivalent of $V_{SS}$. In this state, the PMOS transistor P3 is turned off, and the voltage $V_{B1}$ is equivalent to the input voltage $V_{BB}$. The PMOS transistor P2 acts as a capacitor and charges to $V_{DD}$. The PMOS transistor P1 is turned off since the voltage $V_{B1}$ at its gate is equal to the voltage $V_{BB}$ at its source. In this state, the PMOS transistor P1 is turned off in order to isolate the output line 18 from the input voltage $V_{BB}$.

When the enable signal EN is high, the inverter I1 pulls the voltage $V_{A1}$ down to an equivalent of $V_{SS}$. As a result, the NMOS transistor N1 is turned off in order to isolate the output line 18 from the standby voltage $V_{SS}$. In this state, the voltage level of $V_{B1}$ is equivalent to $V_{BB}-V_{DD}$ due to the combination of the charge ($V_{DD}$) stored in the PMOS transistor P2 and the voltage $V_{BB}$ present across the gate and drain of the PMOS transistor P3. The PMOS transistor P1 is turned on since the voltage $V_{B1}$ at its gate is less than the voltage $V_{BB}$ at its source. Thus, it will be appreciated that the magnitude of the source voltage $V_{DD}$ should be sufficiently greater than the magnitude of the voltage $V_{BB}$ to cause the PMOS transistor P1 to turn on. Once the PMOS transistor P1 is turned on, the output voltage $V_{SSB}$ is pulled to a voltage equivalent to the input voltage $V_{BB}$.

It will be appreciated by those skilled in the art that the above description represents a somewhat idealized analysis in that it does not account for phenomena such as the impact leakage current has on the transfer efficiency of the transfer circuit 10. In fact, a more detailed analysis of the implementation of the transfer circuit 10 shown in FIG. 2 reveals a non-trivial reduction in the transfer efficiency of the transfer circuit 10 due to leakage current through the NMOS transistor N1 and the PMOS transistor P1. Specifically, when the NMOS transistor N1 is turned off (EN=high), a voltage potential equivalent to $-V_{BB}$ exists between its drain ($V_{SSB}=V_{BB}$) and its gate ($V_{A1}=V_{SS}$). This is particularly a problem when the voltage $V_{BB}$ is negative beyond the threshold voltage $V_{TN1}$ of the NMOS transistor N1. For example, for an input voltage $V_{BB}=-0.5$ v and a threshold voltage $V_{TN1}=0.3$ v, the voltage across the drain and gate of the NMOS transistor N1 (i.e., for EN=high) is $-V_{BB}=0.5$ v, which is sufficient to cause inversion in the NMOS transistor N1. As a result, the output voltage $V_{SSB}$ drops to $-0.42$ v, only 84% of the input voltage $V_{BB}$. Similarly, when the PMOS transistor P1 is turned off (EN=low), a voltage potential equivalent to $V_{BB}$ exists between its drain ($V_{SS}=V_{SS}$) and its gate ($V_{B1}=V_{BB}-V_{DD}$). This results in a leakage current $I_{BB}$ through the PMOS transistor P1 that causes considerable $V_{BB}$ dissipation when the transfer circuit 10 is in standby (EN=low).

For reasons appreciated by those skilled in the art, it is desirable for the transfer efficiency as high as possible. Based on the description above, it will also be appreciated that the transfer circuit 10 shown in FIG. 2 leaves considerable room for improvement in terms of transfer efficiency. Thus, a transfer circuit 100 having an improved transfer efficiency compared to the transfer circuit 10 is described below.

Figure 3:
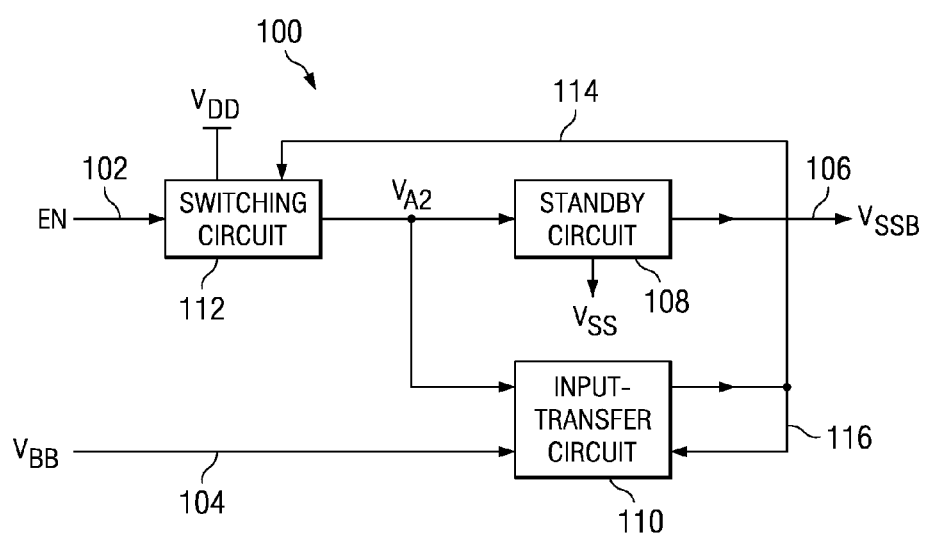
FIG. 3 shows a block diagram of an improved transfer circuit where feedback of the output voltage is used to improve transfer efficiency.

FIG. 3 shows a block diagram of the transfer circuit 100 where feedback of the output voltage $V_{SSB}$ is used to provide for circuit balance in order to improve transfer efficiency by significantly reducing leakage current. As shown in FIG. 3, the transfer circuit 100 includes a control line 102, which serves as a selection signal input, for receiving an enable signal EN (e.g., logic level high or low), which serves as a selection signal. The transfer circuit 100 also includes an input line 104, which serves as a voltage input, for receiving an input voltage $V_{BB}$, and an output line 106, which serves as a voltage output, for outputting an output voltage $V_{SSB}$. In a preferred embodiment, the input voltage $V_{BB}$ is a negative dc voltage. The transfer circuit 100 also includes a standby circuit 108 connected between the output line 106 and $V_{SS}$ (e.g., signal ground from a signal ground line), which serves as a second voltage input. The transfer circuit 100 further includes an input-transfer circuit 110 connected between the input line 104 and the output line 106.

The transfer circuit 100 also includes a switching circuit 112 connected to the standby circuit 108 and the input-transfer circuit 110. The switching circuit 112 is also connected to receive the enable signal EN via the control line 102. The switching circuit 112 is further connected to receive a source voltage $V_{DD}$ (e.g., from a source voltage line) and to receive feedback of the output voltage $V_{SSB}$ from the output line 106 via a feedback line 114, which serves as an output voltage feedback circuit. Preferably, the magnitude of the source voltage $V_{DD}$ is greater than the magnitude of the input voltage $V_{BB}$ for reasons that will become apparent based on the description below. In response to the enable signal EN, the switching circuit 112 outputs (as a switching voltage $V_{A2}$) either a voltage equivalent to the output voltage $V_{SSB}$ or a voltage equivalent to the source voltage $V_{DD}$. The switching voltage $V_{A2}$ causes only one of either the standby circuit 108 or the input-transfer circuit 110 to be enabled at the same time. For example, when the standby circuit 108 is enabled, the input-transfer circuit 110 is disabled, and vice versa.

In a preferred embodiment, when the enable signal EN is low, the switching circuit 112 sets the switching voltage $V_{A2}$ to the equivalent of the source voltage $V_{DD}$, causing the standby circuit 108 to be enabled. The standby circuit 108 in turn causes the voltage $V_{SSB}$ on the output line 106 to be equivalent to $V_{SS}$. Conversely, when the enable signal EN is high, the switching circuit 112 sets the switching voltage $V_{A2}$ to the equivalent of the output voltage $V_{SSB}$, causing the input-transfer circuit 110 to be enabled. The input-transfer circuit 110 in turn causes the voltage $V_{SSB}$ on the output line 106 to be equivalent to the input voltage $V_{BB}$. The voltage $V_{SSB}$ is also fed back to the input-transfer circuit 110 via a feedback line 116, which serves as an output voltage feedback circuit.

Figure 4:
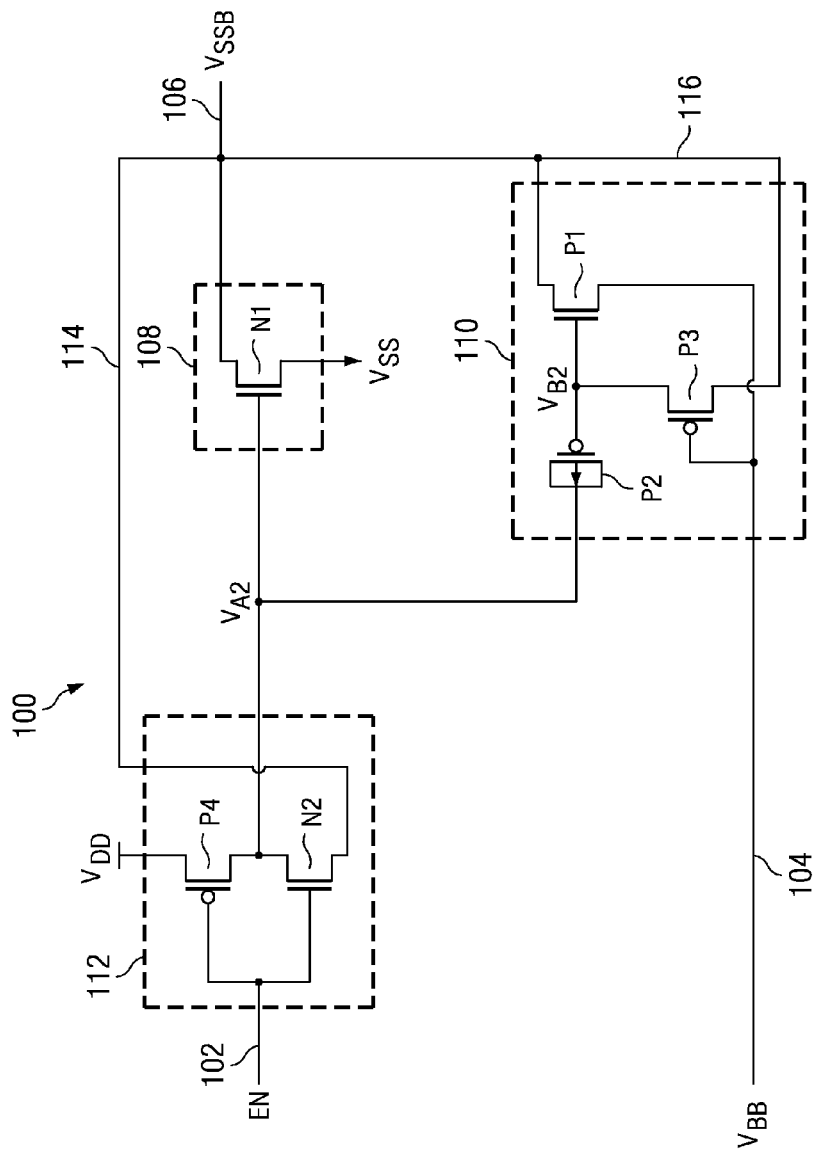
FIG. 4 shows a circuit diagram schematically illustrating an implementation of the transfer circuit in the block diagram shown in FIG. 3.

FIG. 4 shows a circuit diagram schematically illustrating one embodiment of a transfer circuit 100 implementing the block diagram shown in FIG. 3. In this embodiment, the standby circuit 108 is implemented with an NMOS transistor N1 having its source connected to $V_{SS}$ (e.g., signal ground line) and its drain connected to the output line 106. The gate of the NMOS transistor N1 is connected to receive the switching voltage $V_{A2}$ from the switching circuit 112.

The input-transfer circuit 110 is implemented in this embodiment with three PMOS transistors P1-P3. The PMOS transistor P1 has its drain connected to the output line 106 and its source connected to the input line 104. The gate of the PMOS transistor P1 is connected to receive a voltage $V_{B2}$ from a node that is connected to both the gate of the PMOS transistor P2 and the drain of the PMOS transistor P3. The PMOS transistor P2 is configured to serve as a MOS capacitor, having its drain and source both connected to receive the switching voltage $V_{A2}$ from the switching circuit 112. The PMOS transistor P3 has its source connected to receive the output voltage $V_{SSB}$ via the feedback line 116 from the output line 106. The gate of the PMOS transistor P3 is connected to the input line 104.

The switching circuit 112 is implemented as a CMOS device, having a PMOS transistor P4 and an NMOS transistor N2. The source of the PMOS transistor P4 is connected to receive the source voltage $V_{DD}$ (e.g., from a source voltage line). The source of the NMOS transistor N2 is connected to the feedback line 114 to receive the output voltage $V_{SSB}$. The PMOS transistor P4 and the NMOS transistor N2 have their drains connected together and provide the switching voltage $V_{A2}$. The gates of the PMOS transistor P4 and the NMOS transistor N2 are connected to the control line 102 to receive the input signal EN.

Still referring to FIG. 4, the transfer circuit 100 operates as follows. In a preferred embodiment, the enable signal EN provides a logic level high or a logic level low, and the input voltage $V_{BB}$ is a negative dc voltage. In this embodiment, when the enable signal EN is low, the transfer circuit 100 is in standby mode and the output voltage $V_{SSB}$ is equivalent to $V_{SS}$. Conversely, when the enable signal EN high, the transfer circuit 100 is in active mode and the output voltage $V_{SSB}$ is equivalent to the input voltage $V_{BB}$. Operation of the transfer circuit 100 is described below for each of these logic levels of the enable signal EN.

When the enable signal EN is low, the PMOS transistor P4 is turned on and the NMOS transistor N2 is turned off, thereby pulling the switching voltage $V_{A2}$ up to a voltage equivalent to the source voltage $V_{DD}$. Consequently, the NMOS transistor N1 is turned on, thereby pulling the output voltage $V_{SSB}$ down to an equivalent of $V_{SS}$. In addition, the PMOS P3 is turned on since the input voltage $V_{BB}$ ($V_{BB}$ being a negative voltage) provided at its gate is more negative than the feedback of the output voltage $V_{SSB}$ ($V_{SSB}$ equivalent to $V_{SS}$) provided at its source (i.e., $V_{BB}<V_{SSB}$). As a result, the voltage $V_{B2}$ drops to $V_{SS}$. The PMOS P2 then acts as a capacitor between the source voltage $V_{DD}$ (through PMOS transistor P4) and $V_{SS}$ (through PMOS transistor P3), and therefore charges to $V_{DD}$. The PMOS transistor P1 is turned off since the voltage $V_{B2}$ at its gate is greater than the voltage $V_{BB}$ ($V_{BB}$ being a negative voltage) at its source (i.e., $V_{B2}>V_{BB}$). Thus, when the enable signal EN is low, the output voltage $V_{SSB}$ is equivalent to $V_{SS}$.

When the enable signal EN is high, the PMOS transistor P4 is turned off and the NMOS transistor N2 is turned on, thereby pulling the switching voltage $V_{A2}$ to a voltage equivalent to the output voltage $V_{SSB}$. During a transition phase that exists for a short period immediately after the enable signal EN switches from low to high, the switching voltage $V_{A2}$ is set equivalent to $V_{SS}$ (since $V_{SSB}$ is equivalent to $V_{SS}$ for EN=low). Once the transfer circuit 100 reaches steady-state, the switching voltage will be set to $V_{BB}$ (since $V_{SSB}$ is equivalent to $V_{BB}$ for EN=high). Once the switching voltage $V_{A2}$ is equivalent to $V_{SSB}$, the NMOS transistor N1 is turned off (since both $V_{SS}$ and $V_{BB}$ are $\leq V_{SS}$). Also, once $V_{A2}$ switches to $V_{SSB}$, the voltage stored in P2 and present at $V_{B2}$ appears as a negative potential to the gate of the PMOS transistor P1. Specifically, the voltage at $V_{B2}$ is equivalent to $-V_{DD}$ during transition, and is equivalent to $V_{BB}-V_{DD}$ at steady-state. As a result, the PMOS transistor P1 is turned on (since both $-V_{DD}$ and $V_{BB}-V_{DD}$ are $<V_{BB}$), thereby pulling the output voltage $V_{SSB}$ to a voltage equivalent to $V_{BB}$. In addition, the PMOS transistor P3 will turn off since the feedback of the output voltage $V_{SSB}$ at its source is equivalent to the input voltage $V_{BB}$ at its gate. Thus, when the enable signal EN is high, the output voltage $V_{SSB}$ is equivalent to the input voltage $V_{BB}$.

Having now described operation of the transfer circuit 100, the improvement in transfer efficiency can more readily be discussed. As mentioned above, in the transfer circuit 100 feedback of the output voltage $V_{SSB}$ is used to provide for a voltage balance in order to improve transfer efficiency by significantly reducing leakage current. For example, referring still to the transfer circuit 100 shown in FIG. 4, when the NMOS transistor N1 is turned off (EN=high), the feedback of the output voltage through the switching circuit 112 (specifically, through the NMOS transistor N2) adjusts the voltage at $V_{A2}$ to an equivalent of $V_{BB}$. Therefore, no significant voltage potential exists across the drain ($V_{SSB}=V_{BB}$) and the gate ($V_{A2}=V_{BB}$) of the NMOS transistor N2. As a result, the leakage current, which occurs when the voltage $V_{BB}$ is negative beyond the threshold voltage $V_{TN1}$ of the NMOS transistor N1, can be significantly reduced or substantially eliminated. Similarly, when the PMOS transistor P1 is turned off (EN=low), no significant voltage potential exists between its drain ($V_{SSB}=V_{SS}$) and its gate ($V_{B2}=V_{SS}$). Thus, compared to the transfer circuit 10, in the transfer circuit 100 almost no leakage current $I_{BB}$ passes through the PMOS transistor P1 when the transfer circuit 10 is in standby (EN=low). The improvements in transfer efficiency of the transfer circuit 100 compared to the transfer circuit 10 are summarized in the following table:

| $V_{BB}$ | Transfer Circuit 10 $V_{SSB}$ | Transfer Circuit 10 Transfer Efficiency | Transfer Circuit 10 $I_{BB}$ dc | Transfer Circuit 100 $V_{SSB}$ | Transfer Circuit 100 Transfer Efficiency | Transfer Circuit 100 $I_{BB}$ dc |
|---|---|---|---|---|---|---|
| −0.30 v | −0.287 v | 95.7% | 4.2 µA | −0.3 v | 100% | 0.17 µA |
| −0.35 v | −0.325 v | 92.9% | 10.5 µA | −0.3499 v | 99.9% | 0.21 µA |
| −0.40 v | −0.360 v | 90.0% | 25.2 µA | −0.3999 v | 99.9% | 0.24 µA |
| −0.45 v | −0.391 v | 86.9% | 56.4 µA | −0.4497 v | 99.9% | 0.27 µA |
| −0.50 v | −0.420 v | 84.0% | 115 µA | −0.4992 v | 99.8% | 0.30 µA |
| −0.55 v | −0.448 v | 81.5% | 211 µA | −0.5457 v | 99.2% | 0.33 µA |
| −0.60 v | −0.475 v | 71.9% | 346 µA | −0.5838 v | 97.3% | 0.36 µA |

Another advantage of the transfer circuit 100 compared to the transfer circuit 10 is that the transfer circuit 100 provides for a good low $V_{DD}$ margin since the voltage swing at $V_{A2}$ is from $V_{DD}$ to $V_{BB}$ (e.g., $V_{BB}$=negative voltage) rather than from $V_{DD}$ to $V_{SS}$ (e.g., $V_{SS}$=signal ground). In addition, since the transfer circuit 100 is a pure-logic device, there is no Deep N Well (DNW) or triple well process requirement, so manufacturing is simplified.

It is contemplated that an alternate embodiment of the transfer circuit 100 can be implemented using capacitor-coupling to turn off the NMOS transistor N1 in a manner similar to the capacitor-coupling architecture (i.e., the PMOS transistors P2 and P3) used for the PMOS transistor P1.

While various embodiments of in accordance with the principles disclosed herein have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A transfer circuit comprising:
    an input line for receiving an input voltage;
    an output line for supplying an output voltage;
    a control line for receiving an enable signal;
    a CMOS device for supplying a switching voltage;
    a feedback line for supplying a feedback of said output voltage to said CMOS device,
    wherein said CMOS device is connected to said control line for receiving said enable signal and for controlling said switching voltage based on said enable signal to have one of a first voltage level and a second voltage level, said second voltage level being equivalent to said feedback of said output voltage;
    an NMOS transistor having a gate connected to said CMOS device for receiving said switching voltage and having a drain connected to said output line for supplying an equivalent of a standby voltage to said output line when said switching voltage is at said first voltage level; and
    a first PMOS transistor having a source connected to said input line and a drain connected to said output line for supplying an equivalent of said input voltage to said output line when said switching voltage is at said second voltage level.

2. A transfer circuit according to claim 1, further comprising a second PMOS transistor having a source and a drain both connected to said CMOS device for receiving said switching voltage, and a gate connected to a gate of the first PMOS transistor.

3. A transfer circuit according to claim 2, further comprising a third PMOS transistor having a source connected to said output line, a drain connected to the gate of the first PMOS transistor, and a gate connected to the input line.

4. A circuit comprising:
    an input line, an output line, a control line, a signal ground line, and a source voltage line;
    a first NMOS transistor having a source connected to the signal ground line, a drain connected to the output line, and a gate;
    a second NMOS transistor having a source connected to the output line, a drain connected to the gate of the first NMOS transistor, and a gate connected to the control line;
    a first PMOS transistor having a source connected to the input line, a drain connected to the output line, and a gate;
    a second PMOS transistor having a source and a drain both connected to the drain of the second NMOS transistor, and a gate connected to the gate of the first PMOS transistor;
    a third PMOS transistor having a source connected to the output line, a drain connected to the gate of the first PMOS transistor, and a gate connected to the input line; and
    a fourth PMOS transistor having a source connected to the source voltage line, a drain connected to the drain of the second NMOS transistor, and a gate connected to the control line.

* * * * *